United States Patent
Shiah et al.

(10) Patent No.: US 10,255,965 B2
(45) Date of Patent: Apr. 9, 2019

(54) MEMORY CIRCUIT CAPABLE OF BEING QUICKLY WRITTEN IN DATA

(71) Applicant: Etron Technology, Inc., Hsinchu (TW)

(72) Inventors: Chun Shiah, Hsinchu (TW); Yu-Hui Sung, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 15/356,681

(22) Filed: Nov. 21, 2016

(65) Prior Publication Data

US 2017/0148500 A1     May 25, 2017

Related U.S. Application Data

(60) Provisional application No. 62/257,241, filed on Nov. 19, 2015.

(51) Int. Cl.

| | | |
|---|---|---|
| *G11C 11/409* | (2006.01) | |
| *G11C 11/4091* | (2006.01) | |
| *G11C 11/408* | (2006.01) | |
| *G11C 11/4096* | (2006.01) | |
| *G06F 3/06* | (2006.01) | |
| *G06F 12/0893* | (2016.01) | |
| *G11C 16/06* | (2006.01) | |
| *G11C 29/34* | (2006.01) | |
| *G11C 11/4076* | (2006.01) | |
| *G11C 29/06* | (2006.01) | |

(52) U.S. Cl.
CPC .......... *G11C 11/4091* (2013.01); *G06F 3/061* (2013.01); *G06F 3/065* (2013.01); *G06F 3/0644* (2013.01); *G06F 3/0659* (2013.01); *G06F 3/0673* (2013.01); *G06F 12/0893* (2013.01); *G11C 11/4076* (2013.01); *G11C 11/4085* (2013.01); *G11C 11/4087* (2013.01); *G11C 11/4096* (2013.01); *G11C 16/06* (2013.01); *G11C 29/34* (2013.01); *G11C 29/06* (2013.01); *G11C 2207/2236* (2013.01)

(58) Field of Classification Search
CPC ............ G11C 11/4091; G11C 11/4085; G11C 11/4096; G11C 11/4087
See application file for complete search history.

(56) References Cited

U.S. PATENT DOCUMENTS

| | | | | |
|---|---|---|---|---|
| 5,666,315 A | * | 9/1997 | Tsukude | G11C 29/83 365/149 |
| 5,953,278 A | * | 9/1999 | McAdams | G11C 7/1018 365/189.02 |
| 6,023,745 A | | 2/2000 | Lu | |

(Continued)

FOREIGN PATENT DOCUMENTS

TW     201335757 A1     9/2013

*Primary Examiner* — Khamdan N. Alrobaie

(74) *Attorney, Agent, or Firm* — Winston Hsu

(57) ABSTRACT

A memory circuit capable of being quickly written in data includes a plurality of banks, and each bank of the plurality of banks includes a plurality of segments. Each segment of the plurality of segments includes a plurality of bit line groups, and each bit line group of the plurality of bit line groups corresponds to a pre-charge line. When a predetermined signal is enabled, a potential is written into memory cells of the each segment corresponding to the each bit line group through the pre-charge line and the each bit line group.

17 Claims, 6 Drawing Sheets

(56) References Cited

U.S. PATENT DOCUMENTS

| | | | |
|---|---|---|---|
| 6,359,825 B1* | 3/2002 | Aimoto | G11C 7/065 |
| | | | 365/149 |
| 6,836,419 B2 | 12/2004 | Loughmiller | |
| 7,342,835 B2 | 3/2008 | Tu | |
| 2001/0022752 A1 | 9/2001 | Duesman | |
| 2004/0037107 A1* | 2/2004 | Matsuoka | G11C 8/16 |
| | | | 365/149 |
| 2005/0146974 A1 | 7/2005 | Halbert | |
| 2008/0219059 A1 | 9/2008 | Li | |
| 2009/0059702 A1* | 3/2009 | Sekiguchi | G11C 5/063 |
| | | | 365/205 |
| 2013/0229868 A1 | 9/2013 | Koh | |
| 2016/0284390 A1 | 9/2016 | Tomishima | |
| 2017/0075595 A1 | 3/2017 | Maejima | |

* cited by examiner

MEMORY CIRCUIT CAPABLE OF BEING QUICKLY WRITTEN IN DATA

CROSS REFERENCE TO RELATED APPLICATIONS

This application claims the benefit of U.S. Provisional Application No. 62/257,241, filed on 2015 Nov. 19 and entitled "Group-write and Copy-row in memory," the contents of which are incorporated herein by reference.

BACKGROUND OF THE INVENTION

1. Field of the Invention

The present invention relates to a memory circuit, and particularly to a memory circuit that can be capable of being quickly written in data.

2. Description of the Prior Art

As shown in FIG. 1, when an application unit (not shown in FIG. 1) coupled to a memory circuit needs to write data into memory cells MC1-MCM of a segment MS1 of a bank B1 of the memory circuit, a controller (not shown in FIG. 1) of the memory circuit first enables an active command ACT corresponding to an address of the bank B1 and a word line WL1. When the controller enables the active command ACT, a word line switch corresponding to the word line WL1 can be turned on according to the active command ACT. After the controller enables the active command ACT, the controller enables a write command WRC corresponding to the address of the bank B1 and an address of the segment MS1. When the controller enables the write command WRC, bit switches corresponding to the bit lines BL1-BLM of the segment MS1 can be turned on according to the write command WRC. Therefore, after the bit switches corresponding to the bit lines BL1-BLM are turned on, the data can be written into the memory cells MC1-MCM in turn through data lines (not shown in FIG. 1) of the memory circuit, the bit lines BL1-BLM, and a sense amplifier SA. In addition, as shown in FIG. 1, WL2-WLN represent word lines, MS2 represents a segment, M, N are integers greater than 1, and all segments of the memory circuit share the sense amplifier SA.

As shown in FIG. 2, because the bit switches corresponding to the bit lines BL1-BLM of the segment MS1 are turned on according to the write command WRC, the write command WRC needs to include M clock signals making the bit switches corresponding to the bit lines BL1-BLM be turned on after the active command ACT, wherein the controller can enable a pre-charge command PREC corresponding to the address of the bank B1 after the write command WRC, and FIG. 2 illustrates a timing of the active command ACT, the write command WRC, and the pre-charge command PREC enabled by the controller.

As shown in FIG. 2, because the write command WRC includes the M clock signals, time for writing the data into the memory cells MC1-MCM at least includes time of the M clock signals and time of the active command ACT, that is, it will take much time to write the data into the memory cells MC1-MCM.

SUMMARY OF THE INVENTION

An embodiment of the present invention provides a memory circuit capable of being quickly written in data. The memory circuit includes a plurality of banks, wherein each bank of the plurality of banks includes a plurality of segments. Each segment of the plurality of segments includes a plurality of bit line groups, each bit line group of the plurality of bit line groups corresponds to a pre-charge line, and when a predetermined signal is enabled, a potential is written into memory cells of the each segment corresponding to the each bit line group through the pre-charge line and the each bit line group.

Another embodiment of the present invention provides a memory circuit capable of being quickly written in data. The memory circuit includes a plurality of banks and a receiver, each bank of the plurality of banks includes a plurality of segments, and each segment of the plurality of segments includes a plurality of bit line groups. The receiver receives a plurality of potentials corresponding to data outside the memory circuit, and correspondingly outputs each potential of the plurality of potentials to a bit line group of the plurality of bit line groups when a predetermined signal is enabled, wherein the each potential is written into memory cells of the each segment corresponding to the bit line group through the bit line group after the each potential is inputted to the bit line group.

Another embodiment of the present invention provides a memory circuit capable of being quickly written in data. The memory circuit includes a plurality of banks, wherein each bank of the plurality of banks includes a plurality of segments. Each segment of the plurality of segments includes a plurality of bit line groups, each bit line group of the plurality of bit line groups is coupled to a pre-charge line, and different pre-charge lines receive an identical potential or different potentials when a predetermined signal is enabled.

Another embodiment of the present invention provides a memory circuit capable of being quickly written in data. The memory circuit includes a plurality of banks and a receiver. Each bank of the plurality of banks includes a plurality of segments, and each segment of the plurality of segments includes a plurality of bit line groups. The receiver receives a plurality of potentials corresponding to data outside the memory circuit, wherein when a predetermined signal is enabled, the receiver receives the plurality of potentials, and correspondingly outputs each potential of the plurality of potentials to a bit line group of the plurality of bit line groups to make the plurality of potentials corresponding to the data be one-time written into memory cells of the each segment corresponding to the plurality of bit line groups.

Another embodiment of the present invention provides a memory circuit capable of being quickly written in data. The memory circuit includes a plurality of banks and a controller. Each bank of the plurality of banks includes a plurality of segments, a first segment of the plurality of segments includes a plurality of bit line groups and a plurality of word lines, and memory cells corresponding to a first word line of the plurality of word lines are divided into a plurality of memory cell groups. The controller receives a control signal group. When a predetermined signal of the memory circuit is enabled, the controller one-time executes a write operation on the plurality of memory cell groups corresponding to the first word line according to the control signal group, wherein data written into an identical memory cell group of the plurality of memory cell groups are identical, and data written into different memory cell groups of the plurality of memory cell groups are identical or different.

Another embodiment of the present invention provides a memory circuit capable of being quickly written in data. The memory circuit includes a plurality of banks, a register, and a controller. Each bank of the plurality of banks includes a plurality of segments, a first segment of the plurality of segments includes a plurality of bit line groups and a plurality of word lines, and memory cells corresponding to a first word line of the plurality of word lines are divided into a plurality of memory cell groups. The register stores a control signal group. The controller one-time executes a write operation on the plurality of memory cell groups corresponding to the first word line according to an enabled predetermined signal and the control signal group.

The present invention provides a memory circuit capable of being quickly written in data. The memory circuit utilizes a plurality of pre-charge lines to quickly write data into memory cells of a segment of the memory circuit when a plurality of equalizers are turned on according to a predetermined signal. Thus, after an active command, because time for writing the data into the memory cells of the segment only includes time of the predetermined signal and time of the active command, compared to the prior art, the time for writing the data into the memory cells of the segment can be significantly reduced. Therefore, the present invention can be applied to an application needing to quickly write data into the memory cells of the segment.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
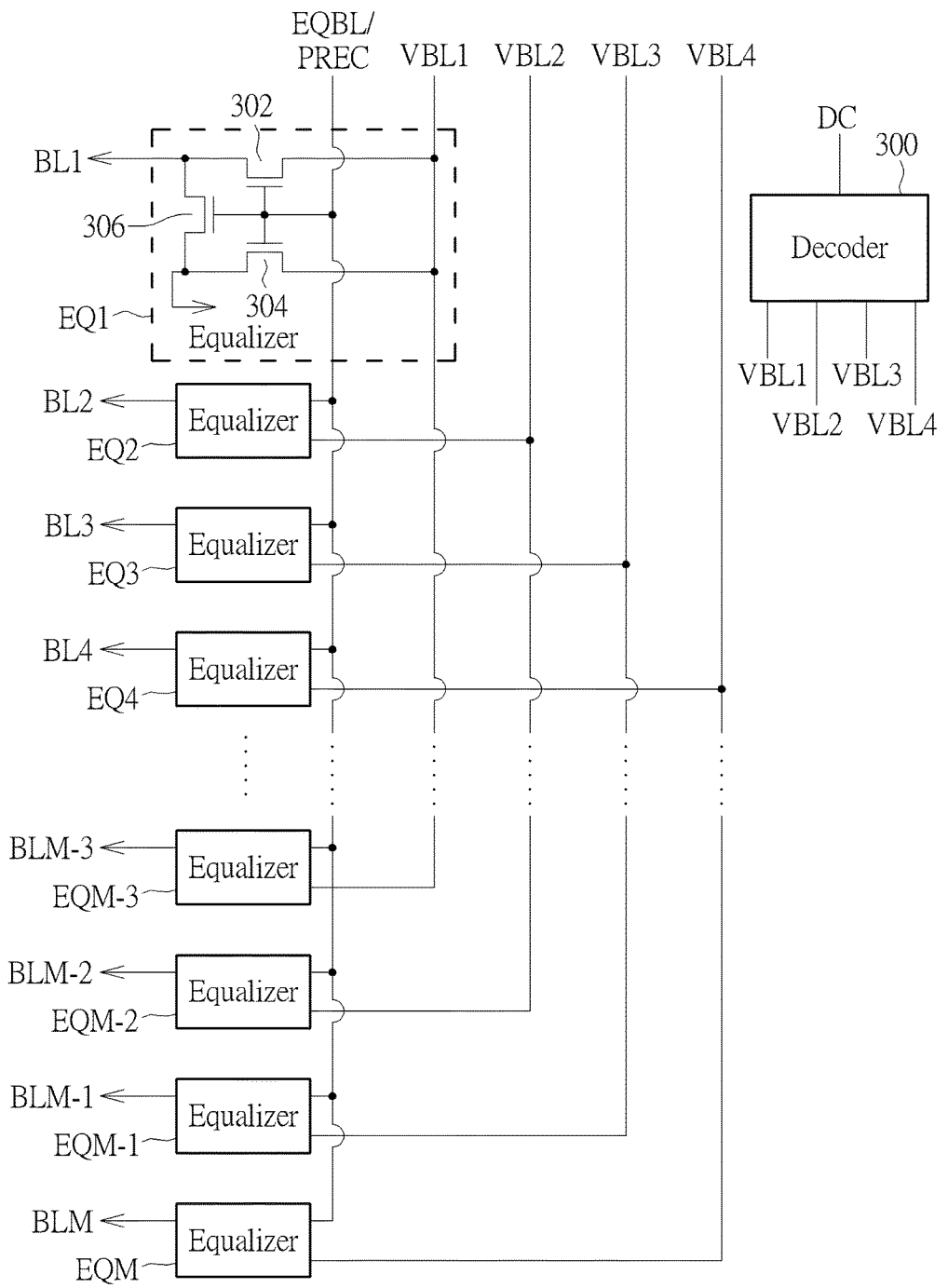
FIG. 3 is a diagram illustrating equalizers of a memory circuit capable of being quickly written in data, bit lines of a segment of a bank of the memory circuit, and a decoder of the memory circuit according to a first embodiment of the present invention.

Please refer to FIG. 3. FIG. 3 is a diagram illustrating equalizers EQ1-EQM of a memory circuit capable of being quickly written in data, bit lines BL1-BLM of a segment of a bank of the memory circuit, and a decoder 300 of the memory circuit according to a first embodiment of the present invention, wherein the memory circuit includes a plurality of banks, each bank of the plurality of banks includes a plurality of segments, M is an integer greater than 1, the bit lines BL1-BLM are divided into 4 bit line groups, each bit line group of the 4 bit line groups includes at least one bit line, bit line numbers of the 4 bit line groups can be identical or different, and the memory circuit is a dynamic random access memory (DRAM). But, the present invention is not limited to the bit lines BL1-BLM being divided into 4 bit line groups. That is, the bit lines BL1-BLM can be divided into a plurality of bit line groups. As shown in FIG. 3, the bit lines BL1-BLM-3 correspond to a pre-charge line VBL1, the bit lines BL2-BLM-2 correspond to a pre-charge line VBL2, the bit lines BL3-BLM-1 correspond to a pre-charge line VBL3, and the bit lines BL4-BLM correspond to a pre-charge line VBL4, wherein the bit lines BL1 is coupled to the pre-charge line VBL1 through the equalizer EQ1, the bit line BL2 is coupled to the pre-charge line VBL2 through the equalizer EQ2, the bit line BL3 is coupled to the pre-charge line VBL3 through the equalizer EQ3, and the bit line BL4 is coupled to the pre-charge line VBL4 through the equalizer EQ4, and so on. As shown in FIG. 3, the decoder 300 is coupled to the pre-charge lines VBL1-VBL4 for generating 4 potentials corresponding to a data code DC according to the data code DC, and correspondingly outputting the 4 potentials to the pre-charge lines VBL1-VBL4, wherein the data code DC is a 4-bit binary code. For example, when the data code DC is "0001", the decoder 300 generates the 4 potentials (logic-low potential "L", logic-low potential "L", logic-low potential "L", logic-high potential "H") corresponding to the data code DC "0001" according to the data code DC "0001", and correspondingly outputs the 4 potentials (logic-low potential "L", logic-low potential "L", logic-low potential "L", logic-high potential "H") to the pre-charge lines VBL1-VBL4, wherein a relationship between the data code DC and the 4 potentials corresponding to the data code DC can be referred to TABLE 1, but the present invention is not limited to the relationship shown in TABLE 1. In addition, the present invention is also not limited to the data code DC being a 4-bit binary code.

TABLE 1

| data code DC | Potential inputted to the pre-charge line VBL1 | Potential inputted to the pre-charge line VBL2 | Potential inputted to the pre-charge line VBL3 | Potential inputted to the pre-charge line VBL4 |
| --- | --- | --- | --- | --- |
| 0000 | "L" | "L" | "L" | "L" |
| 0001 | "L" | "L" | "L" | "H" |
| 0010 | "L" | "L" | "H" | "L" |
| 0011 | "L" | "L" | "H" | "H" |
| 0100 | "L" | "H" | "L" | "L" |
| 0101 | "L" | "H" | "L" | "H" |
| 0110 | "L" | "H" | "H" | "L" |
| 0111 | "L" | "H" | "H" | "H" |
| 1000 | "H" | "L" | "L" | "L" |
| 1001 | "H" | "L" | "L" | "H" |
| 1010 | "H" | "L" | "H" | "L" |
| 1011 | "H" | "L" | "H" | "H" |
| 1100 | "H" | "H" | "L" | "L" |
| 1101 | "H" | "H" | "L" | "H" |
| 1110 | "H" | "H" | "H" | "L" |
| 1111 | "H" | "H" | "H" | "H" |

As shown in FIG. 3, when a predetermined signal EQBL is enabled, transistors 302-306 of the equalizer EQ1 are turned on according to the predetermined signal EQBL. Therefore, when the data code DC is "0001" and the predetermined signal EQBL is enabled, logic-low potential "L" can be quickly written into memory cells of the segment corresponding to the bit lines BL1-BLM-3 through the pre-charge line VBL1 and the bit lines BL1-BLM-3, logic-low potential "L" can be quickly written into memory cells of the segment corresponding to the bit lines BL2-BLM-2 through the pre-charge line VBL2 and the bit lines BL2-BLM-2, logic-low potential "L" can be quickly written into memory cells of the segment corresponding to the bit lines BL3-BLM-1 through the pre-charge line VBL3 and the bit lines BL3-BLM-1, and logic-high potential "H" can be quickly written into memory cells of the segment corresponding to the bit lines BL4-BLM through the pre-charge line VBL4 and the bit lines BL4-BLM. In addition, circuit structures and operational principles of the equalizers EQ2-EQM are the same as those of the equalizer EQ1, so further description thereof is omitted for simplicity.

Figure 4:
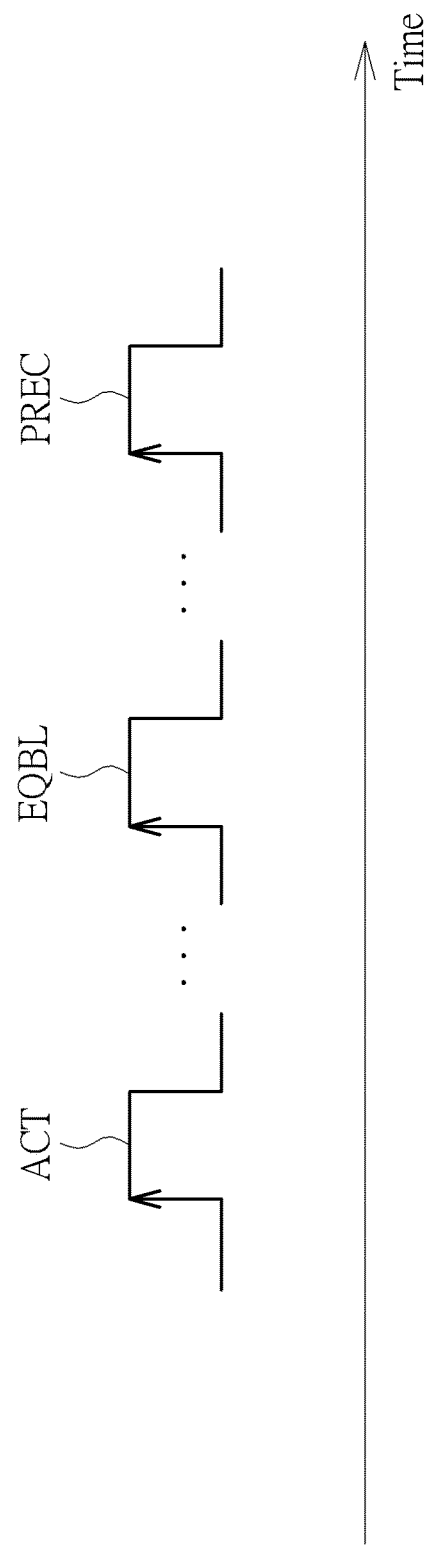
FIG. 4 is a timing diagram illustrating an active command, a predetermined signal and a pre-charge command.

In addition, as shown in FIG. 4, after an active command ACT, because the memory circuit can quickly write data (that is, logic-low potential "L" or logic-high potential "H") into the memory cells of the segment only according to the predetermined signal EQBL, time for writing the data into the memory cells of the segment at least includes time of the predetermined signal EQBL and time of the active command ACT, that is, the time for writing the data into the memory cells of the segment can be significantly reduced (as shown in FIG. 4). Therefore, the present invention can be applied to an application needing to quickly write the data into the memory cells of the segment (e.g. an application which needs to quickly test whether the memory cells of the segment normally operate). In addition, FIG. 4 illustrates a timing of the active command ACT, the predetermined signal EQBL, and a pre-charge command PREC enabled by a controller of the memory circuit.

In addition, after the data are written into the memory cells of the segment through the pre-charge lines VBL1-VBL4 and the bit lines BL1-BLM and when the pre-charge signal PREC is enabled, a pre-charge potential can be written into the memory cells of the segment through the pre-charge lines VBL1-VBL4 and the bit lines BL1-BLM, wherein the pre-charge potential is between logic-low potential "L" and logic-high potential "H".

Figure 5:
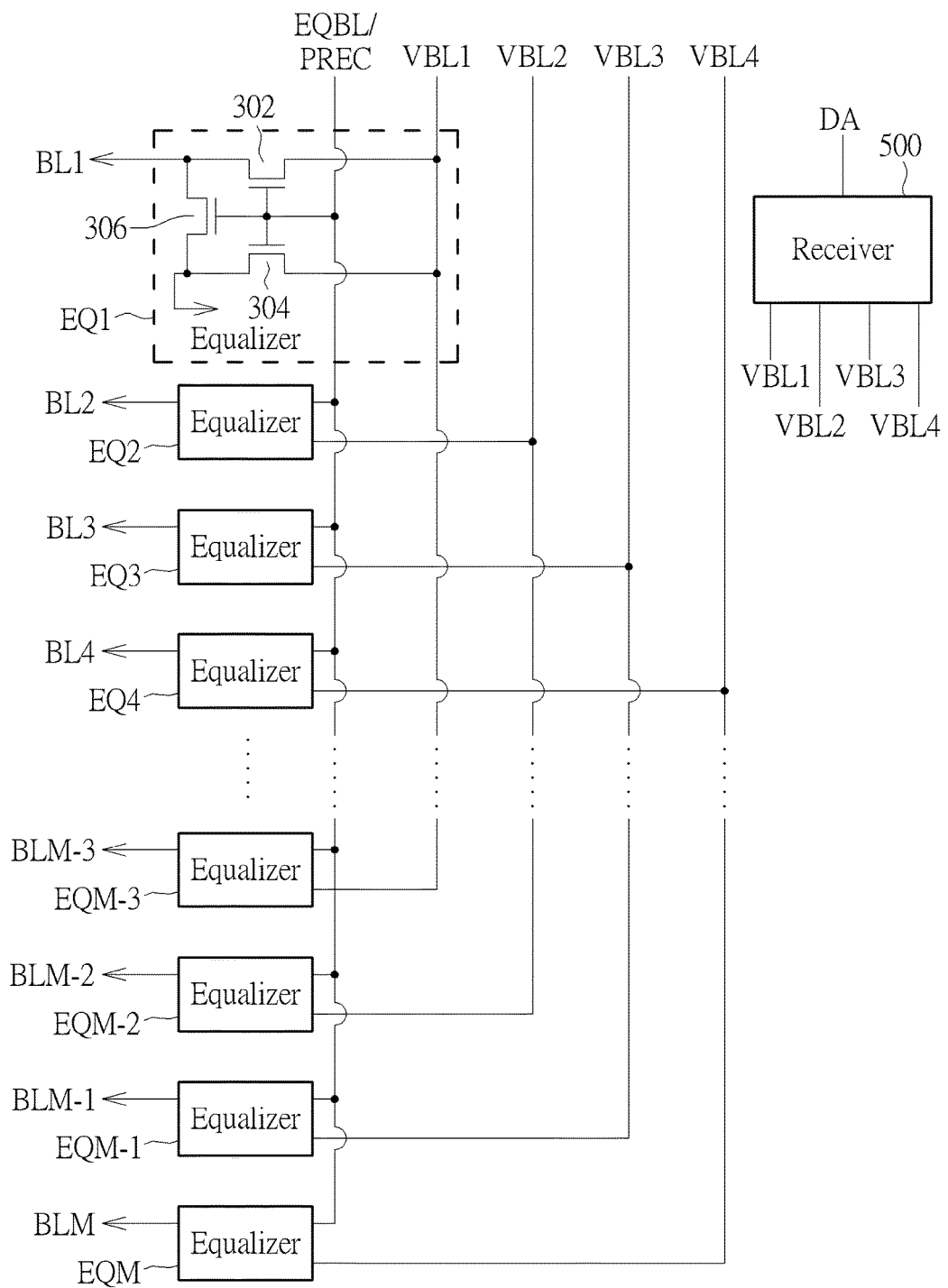
FIG. 5 is a diagram illustrating equalizers of a memory circuit capable of being quickly written in data, bit lines of a segment of a bank of the memory circuit, and a receiver of the memory circuit according to a second embodiment of the present invention.

In addition, please refer to FIG. 5. FIG. 5 is a diagram illustrating equalizers EQ1-EQM of a memory circuit capable of being quickly written in data, bit lines BL1-BLM of a segment of a bank of the memory circuit, and a receiver 500 of the memory circuit according to a second embodiment of the present invention. As shown in FIG. 5, because the memory circuit does not include the decoder 300, the receiver 500 directly receives 4 potentials (e.g. 4 logic-low potential "L" or logic-high potential "H") corresponding to data DA outside the memory circuit, and when the predetermined signal EQBL is enabled, one-time correspondingly outputs each potential of the 4 potentials to a bit line group of the 4 bit line groups through a pre-charge line, wherein the 4 potentials can be identical or different. In addition, as shown in FIG. 5, each bit line (e.g. the bit line BL1) of each bit line group (e.g. the bit lines BL1-BLM-3) is coupled to the receiver 500 through a corresponding equalizer (e.g. the equalizer EQ1), and when the predetermined signal EQBL is enabled, the predetermined signal EQBL turns on the corresponding equalizer.

In addition, after the data DA are written into the memory cells of the segment through the receiver 500 and the bit lines BL1-BLM shown in FIG. 5, and when the pre-charge signal PREC is enabled, the pre-charge potential can be one-time written into the memory cells of the segment through the receiver 500 and the bit lines BL1-BLM. In addition, subsequent operational principles of the memory circuit in FIG. 5 are the same as those of the memory circuit in FIG. 3, so further description thereof is omitted for simplicity.

Figure 1:
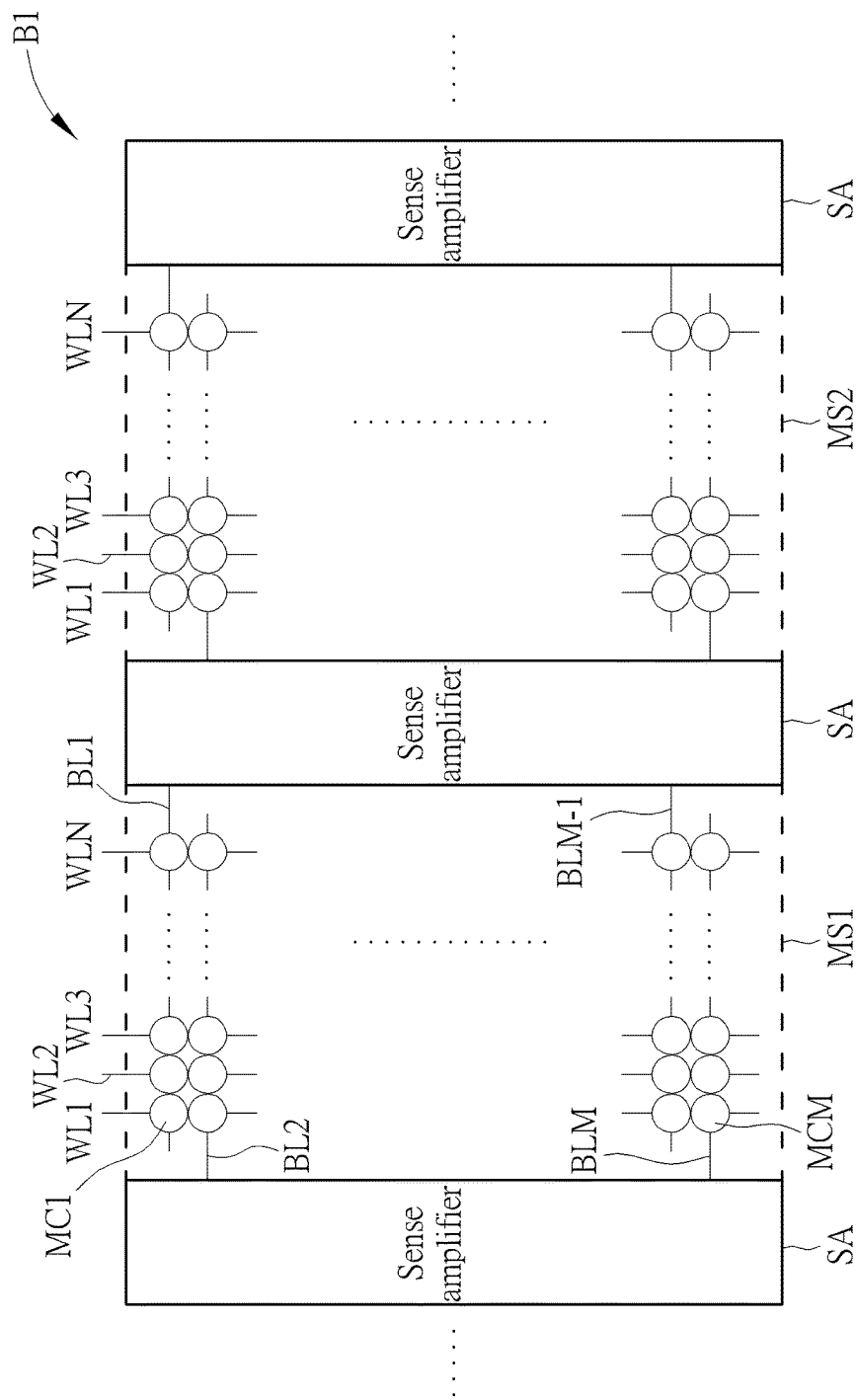
FIG. 1 is a diagram illustrating memory cells and bit lines of segments, word lines, and a sense amplifier of the memory circuit.
Figure 2:
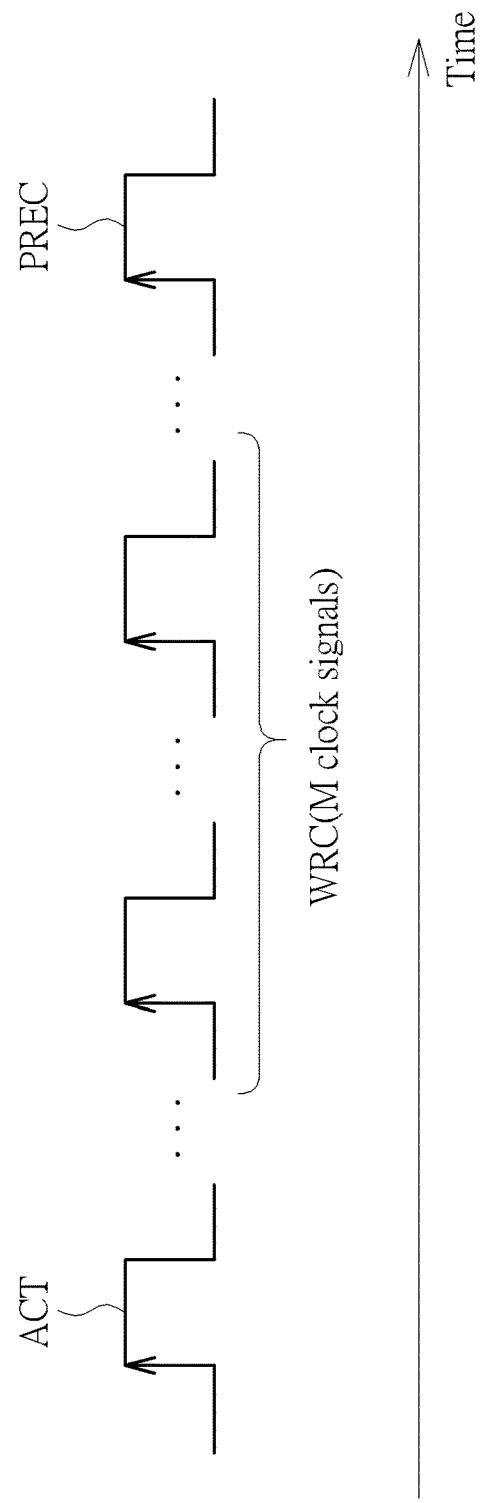
FIG. 2 is a timing diagram illustrating an active command, a write command, and a pre-charge command provided by the prior art.

In addition, in another embodiment of the present invention, data not only can be written into the memory cells of the segment through the above mentioned method shown in FIG. 3 or FIG. 5, but can also be written into the memory cells of the segment through the method shown in FIG. 2 provided by the prior art. In addition, all segments of the plurality of banks of the memory circuit shown in FIG. 3 or FIG. 5 can share the equalizers EQ1-EQM.

In addition, in another embodiment of the present invention, the receiver 500 can be replaced with the controller of the memory circuit. That is to say, the controller of the memory circuit not only can enable the active command ACT, the predetermined signal EQBL, and the pre-charge command PREC shown in FIG. 4, but can also directly receives the 4 potentials (that is, a control signal group) corresponding to the data DA outside the memory circuit. But, in another embodiment of the present invention, the receiver 500 can be replaced with another controller included in the memory circuit, and the another controller directly receives the 4 potentials (that is, the control signal group) corresponding to the data DA outside the memory circuit. However, in another embodiment of the present invention, the 4 potentials (that is, the control signal group) corresponding to the data DA are stored in a register (e.g. a mode register within the memory circuit or an extended register within the memory circuit) further included in the memory circuit, and the controller of the memory circuit receives the 4 potentials (that is, the control signal group) corresponding to the data DA from the register. Then, the controller one-time executes a write operation on a plurality of memory cell groups corresponding to a word line of the segment (wherein each memory cell group of the plurality of memory cell groups can correspond to a bit line group of the 4 bit line groups shown in FIG. 5) according to the 4 potentials (that is, the control signal group) corresponding to the data DA, wherein data written into the each memory cell group of the plurality of memory cell groups are identical, and data written into different memory cell groups of the plurality of memory cell groups are identical or different.

Figure 6:
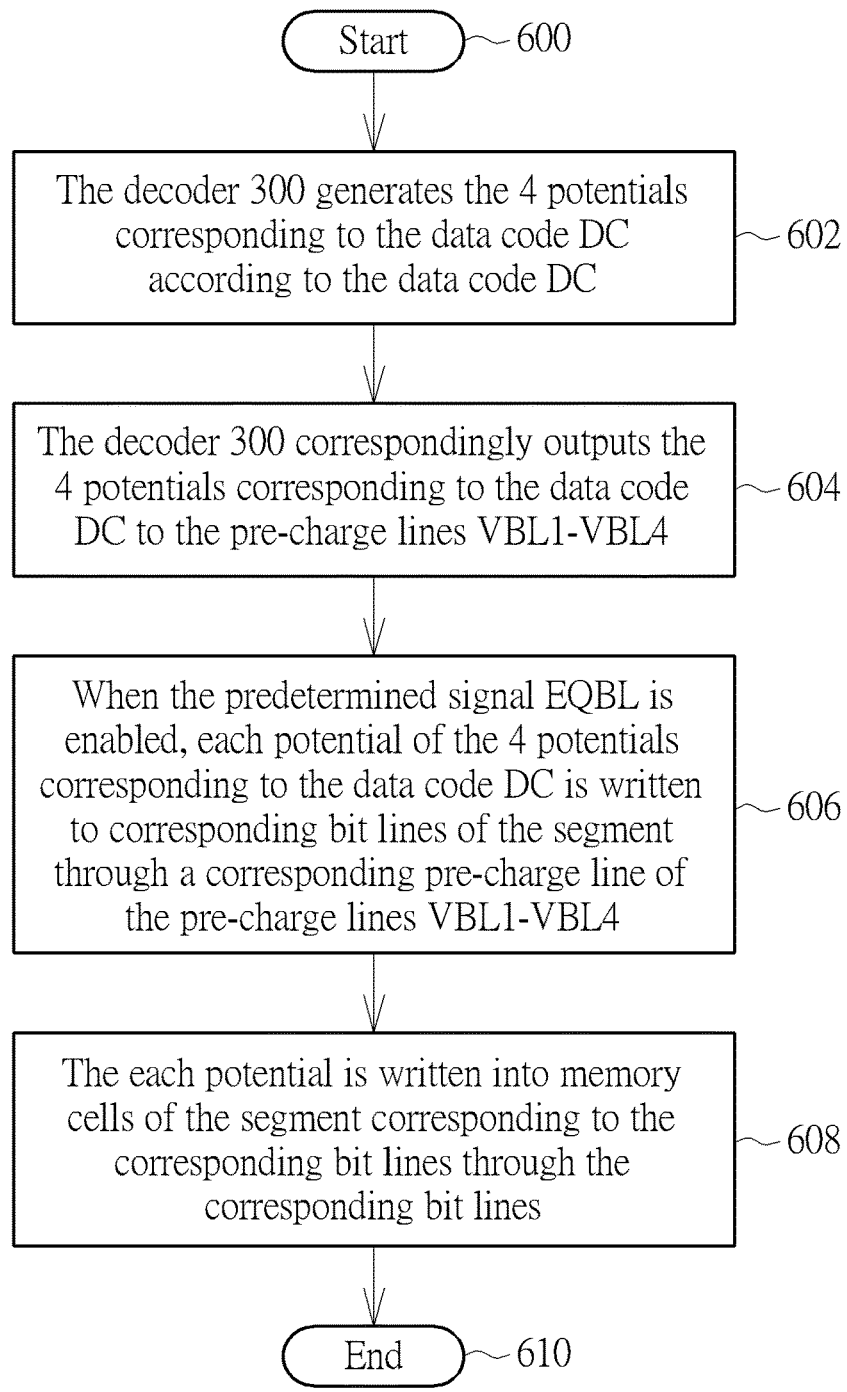
FIG. 6 is a flowchart illustrating an operation method for quickly writing data into a memory circuit according to a third embodiment of the present invention.

Please refer to FIGS. 3, 4, 6. FIG. 6 is a flowchart illustrating an operation method capable of quickly writing data into a memory circuit according to a third embodiment of the present invention. The operation method in FIG. 6 is illustrated using the equalizers EQ1-EQM, the bit lines BL1-BLM of the segment, and the decoder 300 in FIG. 3. Detailed steps are as follows:

Step 600: Start.
Step 602: The decoder 300 generates the 4 potentials corresponding to the data code DC according to the data code DC.
Step 604: The decoder 300 correspondingly outputs the 4 potentials corresponding to the data code DC to the pre-charge lines VBL1-VBL4.
Step 606: When the predetermined signal EQBL is enabled, each potential of the 4 potentials corresponding to the data code DC is written into corresponding bit lines of the segment through a corresponding pre-charge line of the pre-charge lines VBL1-VBL4.
Step 608: The each potential is written into memory cells of the segment corresponding to the corresponding bit lines through the corresponding bit lines.
Step 610: End.

In Step 602 and Step 604, as shown in FIG. 3, the decoder 300 is used for generating the 4 potentials corresponding to the data code DC according to the data code DC, and correspondingly outputting the 4 potentials to the pre-charge lines VBL1-VBL4. For example, when the data code DC is "0001", the decoder 300 generates the 4 potentials (logic-low potential "L", logic-low potential "L", logic-low potential "L", logic-high potential "H") corresponding to the data code DC "0001" according to the data code DC "0001", and correspondingly outputs the 4 potentials (logic-low potential "L", logic-low potential "L", logic-low potential "L", logic-high potential "H") to the pre-charge lines VBL1-VBL4, wherein the relationship between the data code DC and the 4 potentials corresponding to the data code DC can be referred to TABLE 1.

In Step 606 and Step 608, as shown in FIG. 3, when the predetermined signal EQBL is enabled, the transistors 302-306 of the equalizer EQ1 are turned on according to the predetermined signal EQBL. Therefore, when the data code DC is "0001" and the predetermined signal EQBL is enabled, logic-low potential "L" can be quickly written into the memory cells of the segment corresponding to the bit lines BL1-BLM-3 through the pre-charge line VBL1 and the bit lines BL1-BLM-3, logic-low potential "L" can be quickly written into the memory cells of the segment corresponding to the bit lines BL2-BLM-2 through the pre-charge line VBL2 and the bit lines BL2-BLM-2, logic-low potential "L" can be quickly written into the memory cells of the segment corresponding to the bit lines BL3-BLM-1 through the pre-charge line VBL3 and the bit lines BL3-BLM-1, and logic-high potential "H" can be quickly written into the memory cells of the segment corresponding to the bit lines BL4-BLM through the pre-charge line VBL4 and the bit lines BL4-BLM.

In addition, as shown in FIG. 4, after the active command ACT, because the memory circuit can quickly write the data (that is, logic-low potential "L" or logic-high potential "H") into the memory cells of the segment only according to the predetermined signal EQBL, the time for writing the data into the memory cells of the segment at least includes the time of the predetermined signal EQBL and the time of the active command ACT, that is, the time for writing the data into the memory cells of the segment can be significantly reduced (as shown in FIG. 4).

In addition, after the data are written into the memory cells of the segment through the pre-charge lines VBL1-VBL4 and the bit lines BL1-BLM and when the pre-charge signal PREC is enabled, the pre-charge potential can be written into the memory cells of the segment through the pre-charge lines VBL1-VBL4 and the bit lines BL1-BLM, wherein the pre-charge potential is between logic-low potential "L" and logic-high potential "H".

To sum up, the memory circuit utilizes the pre-charge lines to quickly write the data into the memory cells of the segment when the equalizers are turned on according to the predetermined signal. Thus, after the active command, because the time for writing the data into the memory cells of the segment only includes the time of the predetermined signal and the time of the active command, compared to the prior art, the time for writing the data into the memory cells of the segment can be significantly reduced. Therefore, the present invention can be applied to the application needing to quickly write data into the memory cells of the segment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory circuit capable of being quickly written in data, comprising:
    a plurality of banks, wherein each bank of the plurality of banks comprises a plurality of segments;
    wherein each segment of the plurality of segments comprises a plurality of bit line groups, each bit line group of the plurality of bit line groups is coupled to a corresponding pre-charge line, a number of the plurality of bit line groups is equal to a number of a plurality of pre-charge lines corresponding to the plurality of bit line groups;
    wherein each bit line of bit lines comprised in the each segment is further electrically connected to a data line and a sense amplifier, and one of a write potential being written into the each bit line through the data line and the sense amplifier, and the write potential being written into the each bit line through a pre-charge line is executed when a predetermined signal is enabled, wherein the pre-charge line is electrically connected to a bit line group which comprises the each bit line.

2. The memory circuit of claim 1, further comprising:
    a decoder coupled to a plurality of pre-charge lines corresponding to the plurality of bit line groups for generating a plurality of potentials corresponding to a data code according to the data code and correspondingly outputting the plurality of potentials to the plurality of pre-charge lines.

3. The memory circuit of claim 2, wherein the data code is a binary code.

4. The memory circuit of claim 1, wherein the each bit line group comprises at least one bit line.

5. The memory circuit of claim 1, wherein each bit line of the each bit line group is coupled to the corresponding pre-charge line through a corresponding equalizer, and when the predetermined signal is enabled, the predetermined signal turns on the corresponding equalizer through the pre-charge line.

6. The memory circuit of claim 1, wherein after a potential is written into the memory cells of the each segment corresponding to the each bit line group through the corresponding pre-charge line and the each bit line group and when a pre-charge signal is enabled, a pre-charge potential is written into the memory cells of the each segment corresponding to the each bit line group through the corresponding pre-charge line and the each bit line group.

7. The memory circuit of claim 1, wherein the potential is a logic-high potential or a logic-low potential.

8. A memory circuit capable of being quickly written in data, comprising:
    a plurality of banks, wherein each bank of the plurality of banks comprises a plurality of segments, and each segment of the plurality of segments comprises a plurality of bit line groups; and
    a receiver receiving a plurality of potentials corresponding to data outside the memory circuit, and correspondingly outputting each potential of the plurality of potentials to a corresponding bit line group of the plurality of bit line groups through a corresponding pre-charge line of a plurality of pre-charge lines corresponding to the plurality of bit line groups when a predetermined signal is enabled, wherein the each potential is written into memory cells of the each segment corresponding to the bit line group through the bit line group after the each potential is inputted to the bit line group, and a number of the plurality of bit line groups is equal to a number of the plurality of pre-charge lines;
    wherein each bit line of bit lines comprised in the each segment is further electrically connected to a data line and a sense amplifier, and one of a write potential being written into the each bit line through the data line and the sense amplifier, and the write potential being written into the each bit line through a pre-charge line is executed when the predetermined signal is enabled, wherein the pre-charge line is electrically connected to a bit line group which comprises the each bit line.

9. The memory circuit of claim 8, wherein each bit line of the bit line group is coupled to the receiver through a corresponding equalizer, and the predetermined signal turns on the corresponding equalizer when the predetermined signal is enabled.

10. The memory circuit of claim 8, wherein the bit line group comprises at least one bit line.

11. The memory circuit of claim 8, wherein
the receiver receives a pre-charge potential, and the pre-charge potential is written into the memory cells of the each segment corresponding to the bit line group through the receiver and the bit line group after the each potential is written into the memory cells of the each segment corresponding to the bit line group through the receiver and the bit line group and when a pre-charge signal is enabled.

12. The memory circuit of claim 8, wherein the each potential is a logic-high potential or a logic-low potential.

13. A memory circuit capable of being quickly written in data, comprising:
a plurality of banks, wherein each bank of the plurality of banks comprises a plurality of segments;
wherein each segment of the plurality of segments comprises a plurality of bit line groups, each bit line group of the plurality of bit line groups is coupled to a corresponding pre-charge line of a plurality of pre-charge lines corresponding to the plurality of bit line groups, a number of the plurality of bit line groups is equal to a number of the plurality of pre-charge lines, and the plurality of pre-charge lines receive an identical potential or different potentials when a predetermined signal is enabled;
wherein each bit line of bit lines comprised in the each segment is further electrically connected to a data line and a sense amplifier, and one of a write potential being written into the each bit line through the data line and the sense amplifier, and the write potential being written into the each bit line through a pre-charge line is executed when the predetermined signal is enabled, wherein the pre-charge line is electrically connected to a bit line group which comprises the each bit line.

14. The memory circuit of claim 13, wherein the each bit line group writes a potential received by the corresponding pre-charge line into memory cells of the each segment corresponding to the each bit line group.

15. A memory circuit capable of being quickly written in data, comprising:
a plurality of banks, wherein each bank of the plurality of banks comprises a plurality of segments, and each segment of the plurality of segments comprises a plurality of bit line groups; and
a receiver receiving a plurality of potentials corresponding to data outside the memory circuit, wherein when a predetermined signal is enabled, the receiver receives the plurality of potentials, and correspondingly outputs each potential of the plurality of potentials to a corresponding bit line group of the plurality of bit line groups through a corresponding pre-charge line of a plurality of pre-charge lines corresponding to the plurality of bit line groups to make the plurality of potentials corresponding to the data be one-time written into memory cells of the each segment corresponding to the plurality of bit line groups, wherein a number of the plurality of bit line groups is equal to a number of the plurality of pre-charge lines;

wherein each bit line of bit lines comprised in the each segment is further electrically connected to a data line and a sense amplifier, and one of a write potential being written into the each bit line through the data line and the sense amplifier, and the write potential being written into the each bit line through a pre-charge line is executed when the predetermined signal is enabled, wherein the pre-charge line is electrically connected to a bit line group which comprises the each bit line.

16. A memory circuit capable of being quickly written in data, comprising:
a plurality of banks, wherein each bank of the plurality of banks comprises a plurality of segments, a first segment of the plurality of segments comprises a plurality of bit line groups and a plurality of word lines, and memory cells corresponding to a first word line of the plurality of word lines are divided into a plurality of memory cell groups; and
a controller receiving a control signal group;
wherein when a predetermined signal of the memory circuit is enabled, the controller one-time executes a write operation on the plurality of memory cell groups corresponding to the first word line through a plurality of pre-charge lines corresponding to the plurality of memory cell groups according to the control signal group, each pre-charge line of the plurality of pre-charge lines corresponds to one memory cell group of the plurality of memory cell groups, and a number of the plurality of memory cell groups is equal to a number of the plurality of pre-charge lines, wherein data written into an identical memory cell group of the plurality of memory cell groups are identical, and data written into different memory cell groups of the plurality of memory cell groups are identical or different;
wherein each memory cell of memory cells comprised in the first segment is further electrically connected to a data line and a sense amplifier, and one of a write potential being written into the each memory cell through the data line and the sense amplifier, and the write potential being written into the each memory cell through a pre-charge line is executed when the predetermined signal is enabled, wherein the pre-charge line is electrically connected to a memory cell group which comprises the each memory cell.

17. A memory circuit capable of being quickly written in data, comprising:
a plurality of banks, wherein each bank of the plurality of banks comprises a plurality of segments, a first segment of the plurality of segments comprises a plurality of bit line groups and a plurality of word lines, and memory cells corresponding to a first word line of the plurality of word lines are divided into a plurality of memory cell groups;
a register storing a control signal group; and
a controller one-time executing a write operation on the plurality of memory cell groups corresponding to the first word line through a plurality of pre-charge lines corresponding to the plurality of memory cell groups according to an enabled predetermined signal and the control signal group, wherein each pre-charge line of the plurality of pre-charge lines corresponds to one memory cell group of the plurality of memory cell groups, and a number of the plurality of memory cell groups is equal to a number of the plurality of pre-charge lines;
wherein each memory cell of memory cells comprised in the first segment is further electrically connected to a data line and a sense amplifier, and one of a write potential being written into the each memory cell through the data line and the sense amplifier, and the write potential being written into the each memory cell through a pre-charge line is executed when the predetermined signal is enabled, wherein the pre-charge line is electrically connected to a memory cell group which comprises the each memory cell.

* * * * *